United States Patent
Butt et al.

(10) Patent No.: US 6,316,168 B1
(45) Date of Patent: Nov. 13, 2001

(54) TOP LAYER IMAGING LITHOGRAPHY FOR SEMICONDUCTOR PROCESSING

(75) Inventors: Shahid Butt, Wappingers Falls; Uwe Paul Schroeder, Poughkeepsie, both of NY (US)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/290,319

(22) Filed: Apr. 12, 1999

(51) Int. Cl.[7] ........................................ G03F 7/36
(52) U.S. Cl. ................ 430/314; 430/313; 430/323; 430/324; 430/950
(58) Field of Search ................ 430/313, 314, 430/323, 324, 950

(56) References Cited

U.S. PATENT DOCUMENTS

| | | | |
|---|---|---|---|
| 4,560,642 | * 12/1985 | Yonezawa | 430/313 |
| 4,661,712 | * 4/1987 | Mobley | 250/492.2 |
| 5,677,112 | * 10/1997 | Urano | 430/325 |
| 5,733,712 | * 3/1998 | Tanaka | 430/314 |
| 5,858,621 | * 1/1999 | Yu | 430/313 |
| 5,908,738 | * 6/1999 | Sato | 430/512 |
| 5,922,503 | * 7/1999 | Spak | 430/270.16 |
| 5,922,516 | * 7/1999 | Yu | 430/314 |
| 5,940,697 | * 8/1999 | Yoo | 438/182 |
| 6,020,243 | * 2/2000 | Wallace | 438/287 |

FOREIGN PATENT DOCUMENTS

| | | |
|---|---|---|
| 64-52142 | * 2/1989 | (JP) . |
| 2-46463 | * 2/1990 | (JP) . |
| 5-251323 | * 9/1993 | (JP) . |

\* cited by examiner

*Primary Examiner*—Mark F. Huff
*Assistant Examiner*—Nicole Barreca
(74) *Attorney, Agent, or Firm*—Donald B. Paschburg

(57) ABSTRACT

A method for etching a surface includes the steps of providing an under layer formed on the surface and a top layer formed on the under layer. The top layer is patterned to expose portions of the under layer, and a layer including silicon is formed on the exposed portions of the under layer. The top layer is removed to expose the under layer in portions other than the portions of the under layer having the silicon layer thereon, and the under layer is etched in portions other than the portions of the under layer having the silicon layer thereon to expose the surface.

20 Claims, 2 Drawing Sheets

TOP LAYER IMAGING LITHOGRAPHY FOR SEMICONDUCTOR PROCESSING

BACKGROUND

1. Technical Field

This disclosure relates to semiconductor fabrication and more particularly, to improved top layer imaging lithography wherein silicon is incorporated in an under layer to provide improved image quality.

2. Description of the Related Art

Semiconductor fabrication processes typically include photolithographic processing to pattern areas of a surface of a semiconductor device to form a protective layer over areas, preferably using a resist material. The protected areas remain during subsequent etching wherein the unprotected areas are etched away as needed. For top layer imaging, an image is formed by exposing and developing a thin imaging layer on the surface of a semiconductor device. The image created by exposing and developing the thin imaging layer is transferred to an under layer by an etching process where the top layer functions as an etch mask. The top layer or imaging layer that remains on the surface withstands the etch process and prevents etching in the protected areas.

After the first etch step, the resist or thin imaging layer is removed. The remaining portion of the under layer may now be used as a mask to etch a stack or substrate below the under layer. A subsequent etch step transfers the pattern of the under layer to the stack or substrate. Since the top layer is present during the under layer etching process, "grass formation" occurs on the top layer. Grass formation is the redeposition of silicon byproducts on the top layer as a result of etching the under layer. Grass formation typically results in a degradation of image transfer to the under layer from the top layer.

The top layer imaging technique also suffers from poor coating quality of the thin imaging layer. In conventional fabrication processes, the top layer performs two functions. First it provides an image to be transferred, and second it provides etch resistance to protect areas of the under layer while etching exposed areas of the under layer. These functions are balanced between image quality of the top layer and the etch resistance of the top layer.

Therefore, a need exists for a method which provides image transfer using an under layer to transfer the image. A further need exists for a method for providing improved coating quality using a high performance photoresist as a top layer by employing silylated portions of an under layer as an etch mask instead of the top layer.

SUMMARY OF THE INVENTION

A method for etching a surface includes the steps of providing an under layer formed on the surface and a top layer formed on the under layer, patterning the top layer to expose portions of the under layer, forming a layer including silicon on the exposed portions of the under layer, removing the top layer to expose the under layer in portions other than the portions of the under layer having the silicon layer thereon and etching the under layer in portions other than the portions of the under layer having the silicon layer thereon to expose the surface.

A method for etching a substrate for semiconductor devices includes the steps of providing an under layer formed on the substrate and a top layer formed on the under layer, patterning the top layer to expose portions of the under layer, forming a layer including silicon on the exposed portions of the under layer, removing the top layer to expose the under layer in portions of the under layer other than the portions of the under layer having the silicon layer thereon and mask open etching the under layer to transfer a pattern defined by the silicon layer to the substrate and etching the substrate in accordance with the pattern of the under layer.

Another method for etching a substrate for semiconductor devices includes the steps of providing an under layer formed from an anti-reflective resist material on the substrate and a top layer formed on the under layer, the top layer including a resist material, patterning the top layer to expose portions of the under layer by exposing and developing the resist material of the top layer, silylating the exposed portions of the under layer to form a silylated layer thereon by implanting silicon ions in the exposed portions of the under layer, removing the top layer to expose the under layer in portions of the under layer other than the portions of the under layer having the silylated layer thereon and mask open etching the under layer by providing etchant gases to transfer a pattern defined by the silylated layer to the substrate and etching the substrate in accordance with the pattern of the under layer.

In alternate methods, the top layer may include a photoresist and the step of patterning may include the steps of exposing the photoresist to light and developing the away portions of the resist to expose the portions of the under layer. The step of patterning preferably includes the step of depositing the top layer having a thickness between about 1000 Å and about 3000 Å. The step of forming a layer may include silicon includes the step of ion implanting a material including silicon on the exposed portions of the under layer. The step of ion implanting may include the step of adjusting a penetration depth of the ions to less than a thickness of the top layer. The step of ion implanting may include the step of adjusting an incident angle of the ions to silylate the exposed portions of under layer. The step of forming a layer including silicon may include the step of employing a silicon target for collimated sputtering of the layer including silicon or chemically bonding a reagent including silicon to the exposed portions of the under layer. The implanting silicon ions may include the step of adjusting a penetration depth of the ions to less than a thickness of the top layer and/or adjusting an incident angle of the ions to silylate the exposed portions of under layer. The step of silylating may include the step of employing a silicon target for collimated sputtering of the layer including silicon or chemically bonding a reagent including silicon to the exposed portions of the under layer.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

This disclosure relates to semiconductor fabrication and more particularly, to improved top layer imaging lithography wherein silicon is incorporated in an under layer to provide improved image quality. The present invention includes a method which provides improved semiconductor imaging. A top layer or imaging layer preferably includes a high performance photoresist. The top layer is exposed and developed. By adding silicon to the surfaces of the developed photoresist of the top layer, a protective etching barrier is transferred directly to an under layer which is below the top layer. The silicon may be added to the under layer in many ways as described in further detail herein. The top layer is then stripped leaving an image or pattern used as a mask for etching through the under layer and into a stack or substrate layer in accordance with the invention.

Figure 1:
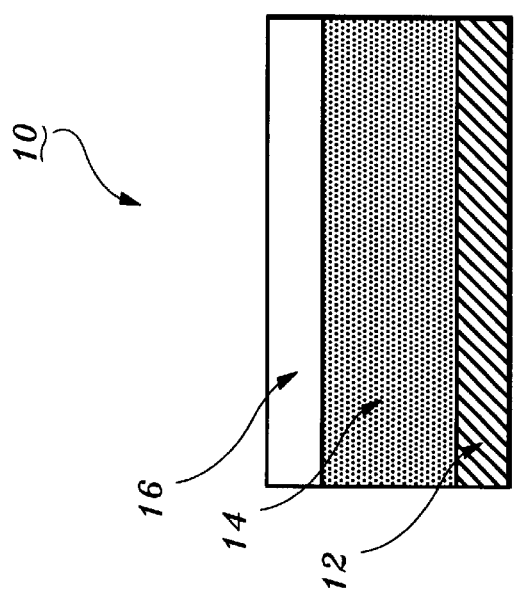
FIG. 1 is a cross-sectional view of a semiconductor structure showing a substrate/stack layer having and under layer and a imaging or top layer formed thereon in accordance with the present invention.

Referring now in specific detail to the drawings in which like reference numerals identify similar or identical elements throughout the several views, and initially to FIG. 1, a semiconductor structure 10 includes a stack/substrate layer 12. Stack/substrate layer 12 may include a silicon substrate, silicon-on insulator substrate, gallium arsenide substrate, etc. wherein a mask needs to be provided for doping or etching processes. Hereinafter stack/substrate layer 12 will be referred to as stack layer 12 for simplicity. Stack layer 12 may include a dielectric stack including a hardmask layer employed as a mask for forming deep trenches for semiconductor memory chips, such as dynamic random access memory (DRAM) chips or embedded DRAM chips. Stack layer 12 may be used in other processes as well. An under layer 14 is deposited on stack layer 12. Under layer 14 preferably includes an anti-reflection coating (ARC) material such as, for example, BARL and AR3 (available commercially from Shipley, Inc.) or DUV30 (available commercially from Brewer) or an MUV (mid ultraviolet) resist material. Other materials may be used for under layer 14 as well.

A thin imaging layer or top layer 16 is deposited on under layer 14. Imaging layer 16 may be between about 1000 Å and about 3000 Å in thickness. Imaging layer 16 is advantageously reduced in thickness over conventional imaging layers to provide improved imaging quality in terms of processing window. In other words, more accurate images are achieved with the thinner imaging layer 16. A conventional resist material, such as DUV may be employed for imaging layer 16, however the material used for imaging layer is preferably optimized to provide high imaging and coating quality. Although no chemical modifications are needed for imaging layer 16, chemical modifications may be implemented to optimize the high imaging and coating quality. Imaging layer 16 may include a negative tone or a positive tone resist. Advantageously, imaging layer 16 may be designed for optimum imaging performance. Etch resistance is no longer a driving factor since, in accordance with the present invention, imaging layer 16 is not used as an etch mask as will be described hereinbelow.

Figure 2:
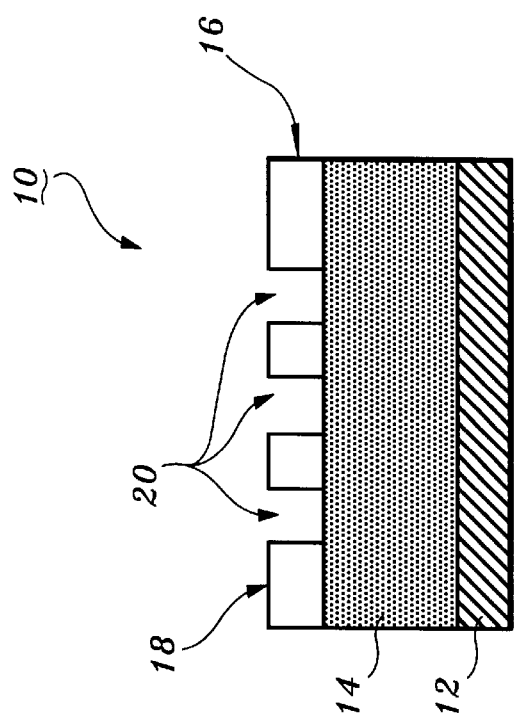
FIG. 2 is a cross-sectional view of the semiconductor structure of FIG. 1 showing the imaging layer patterned in accordance with the present invention.

Referring to FIG. 2, a pattern is transferred into imaging layer 16. Imaging is provided by exposing areas of a surface 18 of imaging layer 16 to light for example ultraviolet light (such as, DUV) through a photolithographic mask (not shown). After exposure, imaging layer 16 is developed using a developer, such as an aqueous alkaline solution. The developer removes portions of imaging layer 16 down to under layer 14 forming holes 20 in imaging layer 16. Under layer 14 is exposed through holes 20 for further processing.

Figure 3:
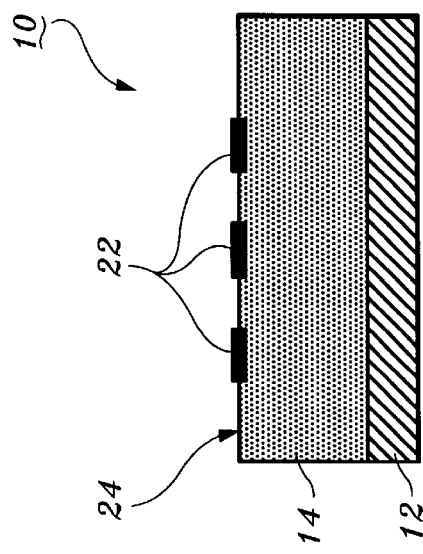
FIG. 3 is a cross-sectional view of the semiconductor structure of FIG. 2 showing the under layer silylated in exposed portions in accordance with the present invention.

Referring to FIG. 3, under layer 14 is exposed to silicon or silylated in exposed regions of under layer 14 where imaging layer 16 was developed away. Silylation may be achieved in several ways. One way to silylate exposed portion of under layer 14 is to perform ion implantation using silicon materials. In a preferred embodiment, low energy, such as an energy between about 10 keV and about 100 keV, and high dose, such as between about $1\times10^{15}$ and about $1\times10^{17}$ silicon ions/cm$^3$ are employed. The implantation is preferably adjusted such that a silylated layer 22 is formed having a penetration depth less than the thickness of imaging layer 16. In this way, under layer 14 is only silylated through holes 20. A steep incident angle a for the ion implants is preferred to form silylate layer 22. An angle of between about 0 degrees to about 30 degrees for a is preferable. If using ion implantation, a deeper depth of silylation is achievable. This brings under layer 14, which is used as a mask in subsequent steps herein, closer to stack layer 12 thereby reducing lateral loss from critical dimensions (CD) of structures to be formed on stack layer 12.

In another embodiment, collimated sputtering using a silicon target is employed to silylate exposed portions of under layer 14. In still another embodiment, a reagent including silicon is chemically bonded to under layer 14. Advantageously, the present invention provides silylation regions 22 at a bottom of a trench or hole imaging layer 16. In this way, silylated regions 22 on top of imaging layer 16 may be removed selectively with respect to regions 22 at the bottom of the trenches. Further, in conventional top surface imaging (TSI) as described above, silicon forms on the surface of the resist as a result of etching the layers below (known as "grass formation"). This silicon formation on imaging layer degrades imaging quality. The present invention avoids any degradation due silicon "grass formation" since no etching of under layer 14 is performed until after imaging layer 16 is removed.

Figure 4:
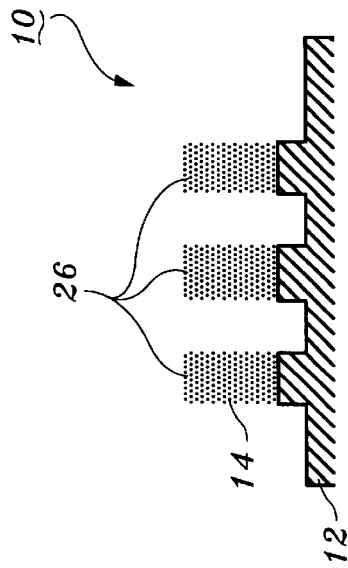
FIG. 4 is a cross-sectional view of the semiconductor structure of FIG. 3 showing the silylated portions on the under layer after stripping away the imaging layer in accordance with the present invention.

Referring to FIG. 4, imaging layer 16 is stripped away leaving under layer 14 with the patterned silylated layer 22 on a top surface 24 of underlayer 14. Imaging layer 16 may be removed by flood exposure to ultraviolet light and developing the remaining portions with an aqueous alkaline solution. Other methods for removing imaging layer 16 may include chemical mechanical polishing (CMP), plasma etching, or equivalent etching processes. Advantageously, imaging layer 16, which preferably includes a photoresist material is removed prior to etching under layer 14. In this way, silicon deposits known in the art as "grass formation" do not have a chance to form on imaging layer as a result of the under layer 14 etching process. "Grass formation" on conventional top surface imaging (TSI) degrades imaging performance when the photoresist on which the "grass formation" occurs is used as a mask to etch the under layer below the photoresist. However, in accordance with the present invention, imaging layer 16, which is preferably a photoresist material, is advantageously not used as an etch mask for etching under layer 14, and imaging layer is removed prior to etching under layer 14. Therefore, "grass formation" is eliminated as an issue in accordance with the present invention.

Figure 5:
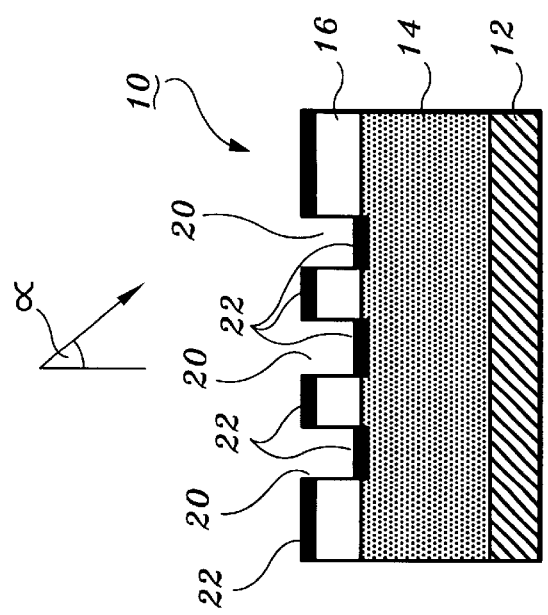
FIG. 5 is a cross-sectional view of the semiconductor structure of FIG. 4 showing the silylated portions of under layer used as an open etch mask in accordance with the present invention.

Referring to FIG. 5, a mask open etch is performed to etch the pattern of silylated layer 22 through under layer 14. The mask open etch may include exposing surface 24 to etchant gases. The etchant gases may include for example oxygen and/or argon. Silylated layer 22 of surface 24 of under layer 14 withstands the etch environment. Under layer 14 is removed from areas unprotected by silylated layer 22. The pattern defined by silylated layer 22 is thereby transferred through under layer 14. Silylated layer 22 may be adjusted in thickness preferably between about 4,000 Å and about 10,000 Å in thickness. Advantageously, the greater thicknesses of silylated layer 22 may provide improved imaging for etching stack layer 12.

Figure 6:
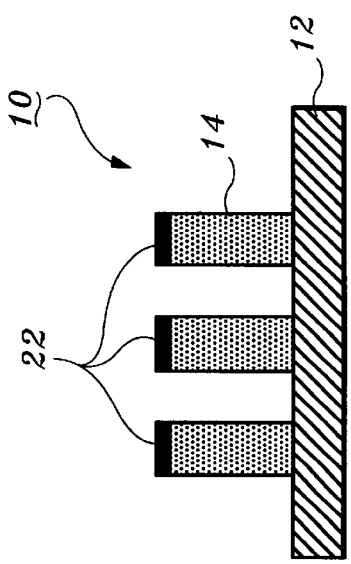
FIG. 6 is a cross-sectional view of the semiconductor structure of FIG. 5 showing substrate/stack layer etched in accordance with the present invention.

Referring to FIG. 6, after the mask open etch, stack layer 12 is etched to form a pattern therein. Remaining portions 26 of under layer 14 function as a mask to permit etching in exposed areas of stack layer 12. Since under layer 14 preferably includes ARC or MUV, excellent etch resistance is provided by under layer 14 to protect unexposed areas of stack layer 12. A selective etching process or other method may be employed to remove remaining portions of under layer 14.

Having described preferred embodiments for improved top layer imaging lithography for semiconductor processing (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for etching a surface comprising the steps of:
   providing an under layer formed from an anti-reflection material on the surface and a top layer formed on the under layer, the top layer including an imaging photoresist;
   patterning the top layer to expose portions of the under layer;
   forming a layer including silicon in the exposed portions of the under layer, by incorporating silicon into the under layer;
   removing the top layer to expose the under layer in portions other than the portions of the under layer having the silicon layer therein; and
   etching the under layer in portions other than the portions of the under layer having the silicon layer thereon to expose the surface.

2. The method as recited in claim 1, wherein the step of patterning includes the steps of exposing the top layer to light and developing away portions of the top layer to expose the portions of the under layer.

3. The method as recited in claim 1, wherein the step of providing includes the step of depositing the top layer having a thickness between about 1000 Å and about 3000 Å.

4. The method as recited in claim 1, wherein the step of forming a layer including silicon includes the step of ion implanting a material including silicon in the exposed portions of the under layer.

5. The method as recited in claim 4, wherein the step of ion implanting includes the step of adjusting a penetration depth of the ions to less than a thickness of the top layer.

6. The method as recited in claim 4, wherein the step of ion implanting includes the step of adjusting an incident angle of the ions to silylate the exposed portions of under layer.

7. The method as recited in claim 1, wherein the step of forming a layer including silicon includes the step of employing a silicon target for collimated sputtering of the layer including silicon.

8. The method as recited in claim 1, wherein the step of forming a layer including silicon includes the step of chemically bonding a reagent including silicon to the exposed portions of the under layer.

9. A method for etching a substrate for semiconductor devices, comprising the steps of:
   providing an under layer formed from an anti-reflection material on the surface and a top layer formed on the under layer, the top layer including an imaging photoresist;
   patterning the top layer to expose portions of the under layer;
   forming a layer including silicon in the exposed portions of the under layer, by incorporating silicon into the under layer;
   removing the top layer to expose the under layer in portions of the under layer other than the portions of the under layer having the silicon layer therein; and
   mask open etching the under layer to transfer a pattern defined by the silicon layer to the substrate; and
   etching the substrate in accordance with the pattern of the under layer.

10. The method as recited in claim 9, wherein the step of patterning includes the steps of exposing the top layer to light and developing away portions of the top layer to expose the portions of the under layer.

11. The method as recited in claim 9, wherein the step of providing includes the step of depositing the top layer having a thickness between about 1000 Å and about 3000 Å.

12. The method as recited in claim 9, wherein the step of forming a layer including silicon includes the step of ion implanting a material including silicon in the exposed portions of the under layer.

13. The method as recited in claim 12, wherein the step of ion implanting includes the step of adjusting a penetration depth of the ions to less than a thickness of the top layer.

14. The method as recited in claim 12, wherein the step of ion implanting includes the step of adjusting an incident angle of the ions to silylate the exposed portions of under layer.

15. The method as recited in claim 9, wherein the step of forming a layer including silicon includes the step of employing a silicon target for collimated sputtering of the layer including silicon.

16. The method as recited in claim 9, wherein the step of forming a layer including silicon includes the step of chemically bonding a reagent including silicon to the exposed portions of the under layer.

17. A method for etching a substrate for semiconductor devices comprising the steps of:
   providing an under layer formed from an anti-reflective resist material on the substrate and a top layer formed on the under layer, the top layer including a resist material;
   patterning the top layer to expose portions of the under layer by exposing and developing the resist material of the top layer;

silylating the exposed portions of the under layer to form a silylated layer therein by implanting silicon ions in the exposed portions of the under layer;

removing the top layer to expose the under layer in portions of the under layer other than the portions of the under layer having the silylated layer therein; and mask open etching the under layer by providing etchant gases to transfer a pattern defined by the silylated layer to the substrate; and etching the substrate in accordance with the pattern of the under layer.

18. The method as recited in claim 17, wherein the step of providing includes the step of depositing the top layer having a thickness between about 1000 Å and about 3000 Å.

19. The method as recited in claim 17, wherein the implanting silicon ions includes the step of adjusting a penetration depth of the ions to less than a thickness of the top layer.

20. The method as recited in claim 19, further comprises the step of adjusting an incident angle of the ions to silylate the exposed portions of under layer.

* * * * *